United States Patent

Naganawa

[19]

[11] Patent Number: 6,064,603

[45] Date of Patent: May 16, 2000

[54] NON-VOLATILE SEMICONDUCTOR STORAGE DEVICE

[75] Inventor: Koji Naganawa, Tokyo, Japan

[73] Assignee: NEC Corporation, Tokyo, Japan

[21] Appl. No.: 09/086,721

[22] Filed: May 29, 1998

[30] Foreign Application Priority Data

May 30, 1997 [JP] Japan ................................. 9-142544

[51] Int. Cl.[7] .................................................. G11C 7/00
[52] U.S. Cl. ............... 365/189.07; 365/236; 365/189.01; 365/189.05
[58] Field of Search .................... 365/189.01, 189.04, 365/189.07, 236, 230.01

[56] References Cited

U.S. PATENT DOCUMENTS

| | | | |
|---|---|---|---|
| 5,687,115 | 11/1997 | Wong et al. ......................... | 365/185.21 |
| 5,802,551 | 9/1998 | Komatsu ............................... | 711/103 |
| 5,873,112 | 2/1999 | Norman ............................... | 365/185.18 |

*Primary Examiner*—Viet Q. Nguyen
*Attorney, Agent, or Firm*—Foley & Lardner

[57] ABSTRACT

A non-volatile semiconductor storage device 100 comprised of a bit number detection circuit 120. The bit number detection circuit 120 has a counting circuit 604, a division control circuit 606 and a latch circuit 602. The counting circuit 604 counts the number of memory cells targeted for data writing. The division control circuit 606 specifies four memory cells for simultaneous data writing on the basis of a count value. The latch circuits 602 expect the circuits corresponding to the specified memory cells are reset for data writing prohibition.

29 Claims, 11 Drawing Sheets

110: WRITING VOLTAGE GENERATING CIRCUIT
118: WRITING PULSE GENERATING CIRCUIT

| SIGNALS | PATTERN 1 | PATTERN 2 | PATTERN 3 | PATTERN 4 |
|---------|-----------|-----------|-----------|-----------|
| DTi | 1 | 1 | 0 | 0 |
| SDi | 1 | 0 | 1 | 0 |
| FLi | 1 | 1 | 0 | 1 |

FIG. 7

| COUNT VALUE (DECIMAL NUMBER) | COUNT VALUE (BINARY NUMBER) | OUTPUT |
|---|---|---|
| 0 | 0000 | 00 |
| 1 | 0000 | 00 |
| 2 | 0001 | |
| 3 | 0010 | |
| 4 | 0011 | |
| 5 | 0100 | 01 |
| 6 | 0101 | |
| 7 | 0110 | |
| 8 | 0111 | |
| 9 | 1000 | 10 |
| 10 | 1001 | |
| 11 | 1010 | |
| 12 | 1011 | |
| 13 | 1100 | 11 |
| 14 | 1101 | |
| 15 | 1110 | |
| 16 | 1111 | |

FIG. 9

| COUNT VALUE | NUMBER OF INSTALLMENTS | ASSIGNMENT 1 | ASSIGNMENT 2 | OUTPUT |
|---|---|---|---|---|
| 0 | 0 | 0 | 0 | 0 0 0 |
| 1 | 1 | 1 | 1 | 0 0 0 |
| 2 | | 2 | 2 | OR |
| 3 | | 3 | 3 | 0 0 1 |
| 4 | | 4 | 4 | |
| 5 | 2 | 4-1 | 3-2 | 0 1 0 |
| 6 | | 4-2 | 3-3 | |
| 7 | | 4-3 | 4-3 | 0 1 1 |
| 8 | | 4-4 | 4-4 | |
| 9 | 3 | 4-4-1 | 3-3-3 | 1 0 0 |
| 1 0 | | 4-4-2 | 4-3-3 | |
| 1 1 | | 4-4-3 | 4-4-3 | 1 0 1 |
| 1 2 | | 4-4-4 | 4-4-4 | |
| 1 3 | 4 | 4-4-4-1 | 4-3-3-3 | 1 1 0 |
| 1 4 | | 4-4-4-2 | 4-4-3-3 | |
| 1 5 | | 4-4-4-3 | 4-4-4-3 | 1 1 1 |
| 1 6 | | 4-4-4-4 | 4-4-4-4 | |

110: WRITING VOLTAGE GENERATING CIRCUIT

1018: WRITING PULSE GENERATING CIRCUIT

1410: WRITING DATA GENERATING CIRCUIT
1418: WRITING PULSE GENERATING CIRCUIT

NON-VOLATILE SEMICONDUCTOR STORAGE DEVICE

BACKGROUND OF THE INVENTION

1. Field of the Invention

The present invention relates to a non-volatile semiconductor storage device, more particularly to an electrically writable non-volatile semiconductor storage such as an EPROM and a flash memory.

2. Description of the Related Art

An EPROM, a flash memory, or the like is known as an electrically writable non-volatile semiconductor storage device. A writing voltage to be applied to memory cells in such non-volatile semiconductor storage device is approximately 6 to 7 V. Each of the memory cells comprises a transistor having floating gates. Injection of electrons to the floating gates causes data writing. This data writing structure requires such relatively high writing voltage.

There are two ways for obtaining a high voltage for writing, external supply and internal boost.

In the former way, the high voltage is supplied to a special power pin of a non-volatile semiconductor storage device. The special power pin is designed in addition to a normal power pin exclusively for high voltage supply.

In the latter way, a boost circuit in a non-volatile semiconductor storage device boosts a voltage supplied as a normal power source. The amount of supplied current for the data writing depends on the current supply ability of the booster. Generally, the amount of the current obtained with the internal boosting way is smaller than that obtained with the external supplying way. Because of this, the number of memory cells which can accept the data writing at a time is also smaller. In case of the number of the memory cells which can accept the data writing per an access is large such as eight or sixteen, a bit line in a memory device is usually divided into a plurality of groups in accordance with the current supply ability of its own booster. In such memory device, the data writing is performed group by group.

FIG. 12 shows a conventional non-volatile semiconductor storage device 1400 which writes data divisionally. The number of memory cells which can accept the data writing at a time in the non-volatile semiconductor storage device 1400 is sixteen. That is, data (16-bit data) can be written/read to/from the sixteen cells per an access. The non-volatile semiconductor storage device 1400 comprises a memory cell array 1402 having a plurality of non-volatile memory cells, a row decoder 1404 and a column switches 1406. The column switches include four column switches 1406-0, 1406-1, 1406-2 and 1406-3.

Each of these column switches 1406-0, 1406-1, 1406-2 and 1406-3 selects four bit lines on the basis of column address AYn. The selected bit lines are connected to corresponding data writing circuits 1412-0, 1412-1, 1412-2 and 1412-3 via data lines DL0 to DL15 and data writing lines WD0 to WD15.

The data writing circuits 1412 receives data rewriting flags from verifying circuits 1414 and a pulse signal PLS from the writing pulse generating circuit 1418. The wiring circuits 1412 supplies a writing voltage Vpump, which is supplied from a writing voltage generating circuit 1410, to the corresponding data writing lines WD0 to WD15 on the basis of the flags and the pulse signal PLS.

An operation of the non-volatile semiconductor storage device 1400 will now be described with reference to FIG. 13.

The writing voltage generating circuit 1410 is activated in response to an externally supplied data writing command (step 1500) to generate the writing voltage Vpump (step 1502). Then, the writing voltage generating circuit 1410 receives an address signal from an address pin (not shown) and accesses address to be written. The writing voltage generating circuit 1410 reads data from the accessed address and supplies it to the verifying circuits 1414 via the data lines DL0 to DL15. The verifying circuits 1414 compare writing data from a data pin (not shown) with the read data (step 1504).

When the read data completely coincide with the writing data (the result of step 1504 is "PASS"), the writing operation is terminated (step 1516). If the coincidence of those is incomplete, it is determined that the verification is failed (the result of step 1504 is "FAIL"), and further sequential steps for writing (described later) are executed for rewriting the data.

"Data writing" in this specification means to switch the mode of the memory cells from erase mode to write mode. Counter switching action is not included in the meaning of "data writing". For example, if the modes of the memory cells are digitized, "1" denotes the memory cell in the erase mode and "0" denotes the memory cell in the write mode. "Write" means to switch "1" to "0", and "erase" means to switch "0" to "1".

After the verifying circuits 1414 detect that the read data do not coincide with the writing data, the verifying circuits 1414 select target memory cells for the data writing from the accessed sixteen memory cells. Then the verifying circuits 1414 activates the data rewriting flags FL0 to FL15, and output the flags to the data writing circuit 1412 (step 1506).

Of the data writing circuits 1412, a data writing circuit 1412-0 corresponds to first 4 bits in the 16-bit data. In response to the writing pulse signal PLS, the data writing circuit 1412-0 supplies the writing voltages vpump to the data writing lines WD0 to WD3 corresponding to the activated data rewriting flags FL0 to FL3 (step 1508). Data writing circuits 1412-1, 1412-2 and 1412-3 sequentially perform the data writing operations in the same manner. Thus, a first cycle of the data writing is completed (steps 1510, 1512 and 1514).

The writing voltage generating circuit 1410 can supply the currents to four memory cells (maximum) per a data writing operation. In other words, the writing voltage generating circuit 1410 does not have the ability to supply currents to sixteen memory cells at a time. Therefore, the non-volatile semiconductor storage device comprises four data writing circuits 1412 and the data writing cycle has four installments of the data writing operations as described above.

After the data writing operation in the first cycle is completed, data stored in the sixteen memory cells are read again. Then the read data is compared with the writing data (step 1504).

When complete coincidence of the both data is detected, the data writing operation is terminated (step 1516). If the coincidence is still incomplete, the sequential data writing steps are executed again because the data writing so far is incomplete. This process is repeated until the complete coincidence of the both data is detected.

As described, the above process includes only the data writing operations without data erasing operations. Therefore, even if the writing data is "1010" which corresponds to, for example, 4 bits data "1100" of 16-bit data for the data writing, the resultant data is "1000". In this case, the data to be written does not coincide with actuary written data even if the data writing operations are repeated. The management for such case depends on the specification of a memory device. Generally, a flag indicating exceeds of retrial times is set to display that the data to be written does not coincide with the actual written data. The management for the activation of such flag also depends on the specification of a memory device.

However, a data rewriting operation requiring the erasing operation seldom occurs usually. Therefore, the flag indicating the exceeds of retrial times is seldom activated.

In the above described conventional non-volatile semiconductor storage device 1400, data to be written is previously divided into four parts for four installments of the writing operations in accordance with the ability of the writing voltage generating circuit 1410. Thus, in spite of the number of the memory cells, the data writing operation must be performed four times. In other words, the four-time data writing operation is required for not only 16-bit data writing but also 1-bit data writing. Therefore, time required for the 1-bit data writing is the same as that for the 16-bit data writing.

SUMMARY OF THE INVENTION

It is an object of the present invention to shorten time for data writing.

It is another object of the present invention to reduce the times of data writing when the number of target bits for the data writing is small.

To achieve the above objects, a non-volatile semiconductor storage device according to the first aspect of the present invention comprises:

a plurality of non-volatile memory cells (102);

reading device (194, 106) for reading out data stored in said plurality of non-volatile memory cells;

comparing device (114) for comparing said data read out by said reading means with data to be stored in said plurality of memory cells;

counting device (120) for counting the number of memory cells of said plurality of non-volatile memory cells for storing said data on the basis of a result of said comparing device; and writing device (112, 118) for specifying at least some of said memory cells for storing data on the basis of a count value of said counting device, and for writing said data to the specified memory cells simultaneously.

According to the invention, data is written only to memory cell requiring data writing. This causes reduction of time for data writing when the number of bits for the data writing is small.

For example, said writing device (112, 118)

(1) simultaneously writes the data to all of the specified memory cells when said count value of said counting device does not exceed a predetermined value (4), and (2) specifies at least some of the specified memory cells when said count value exceeds said predetermined value and simultaneously writes the data to them, then, specifies at least some memory cells in the rest of said specified cells and simultaneously writes the data to them.

The non-volatile semiconductor storage device further comprises a writing voltage generating circuit (110) for supplying a current for the data writing to said writing device, wherein said predetermined value is determined in accordance with the ability of said writing voltage generating circuit. Said writing device may comprise device for controlling supplying time of the data writing current in accordance with the number of the memory cells for the simultaneous data writing. Thus, power consumption can be reduced.

For example, said writing device (112, 118)

(1) simultaneously writes the data to all of the specified memory cells when said count value of said counting device does not exceed a predetermined natural value m, and (2) specifies m memory cells in said specified memory cells when said count value exceeds said predetermined natural value m and simultaneously writes the data to them, then, specifies at least some memory cells in the rest of said specified cells and simultaneously writes the data to them.

This structure allows data to be written to m memory cells in the first data writing and to three memory cells in the second one in the case where the count value is m+3, for example. In the case where the count value is 2·m+3, for example, the data is written to m memory cells in the first and second data writing and is written to three memory cells in the third data writing.

The non-volatile semiconductor storage device may further comprise a writing voltage generating circuit (110) having the ability to supply currents for writing the data to the m memory cells simultaneously. The ability required in the writing voltage generating circuit for supplying the data writing current must not be very high.

For example, said writing device (112, 118)

(1) simultaneously writes the data to all of the specified memory cells when said count value of said counting device does not exceed a predetermined natural value m, and (2) specifies times for the data writing and the number of the memory cells less than m per a data writing, and simultaneously writes the data to the specified memory cells specified times.

This structure allows the data to be written to m−1 memory cells in the first data writing and to four memory cells in the second one in the case where the count value is m+1, for example. In the case where the count value is 2·m+3, for example, the data is written to m−1 memory cells in the first and second data writing and is written to five memory cells in the third data writing. Thus, the number of the memory cells per a data writing can be equalized.

The non-volatile semiconductor storage device may further comprise a writing voltage generating circuit (110) having the ability to simultaneously write data to the specified m memory cells.

Said writing a device may comprise a device for controlling supply time of the data writing current so as to be shortened in accordance with decrease of the number of the memory cells for the simultaneous data writing less than m.

Each of said plurality of memory cells (FIG. 2), for example, comprise a transistor having a floating gate. Injecting electrons to the floating gates causes said data writing.

A method for writing data to non-volatile memory cells according to the second aspect of the present invention comprises steps of:

reading out data stored in a plurality of non-volatile memory cells;

comparing said read data with data to be stored in said plurality of memory cells, and counting the number of the memory cells for data writing; and specifying some of said memory cells for the data writing on the basis of a count value, and simultaneously writing data to said specified memory cells.

For example, said writing step (1) simultaneously writes data to all of the specified memory cells when said count value of said counting device does not exceed a predetermined value (4), and (2) specifies at least some of the specified memory cells when said count value exceeds said predetermined value and simultaneously writes the data to them, then, specifies at least some memory cells in the rest of said specified cells and simultaneously writes the data to them.

The method for writing data to the non-volatile memory cells may comprise a step of controlling supplying time of the data writing current in accordance with the number of the memory cells for the simultaneous data writing.

Said data writing step may (1) simultaneously writes the data to all of the specified memory cells when said count value of said counting device does not exceed a predetermined natural value m, and (2) specifies m memory cells in said specified memory cells when said count value exceeds said predetermined natural value m and simultaneously writes the data to them, then, specifies at least some memory cells in the rest of said specified cells and simultaneously writes the data to them.

The method for writing data to the non-volatile memory cells may shorten time for writing data to each of the memory cells in accordance with decrease of the number of the memory cells for the simultaneous data writing less than m.

BRIEF DESCRIPTION OF THE DRAWINGS

FIG. 7 is a table for explaining count operations of a counter 604 shown in FIG. 6.

FIG. 9 is a table for explaining installments assigning operations of a non-volatile semiconductor storage device according to the second embodiment of the present invention.

DETAILED DESCRIPTION OF THE PREFERRED EMBODIMENT

First Embodiment

A non-volatile semiconductor storage device according to the first embodiment of the present invention will now be described with accompanied drawings.

Figure 1:
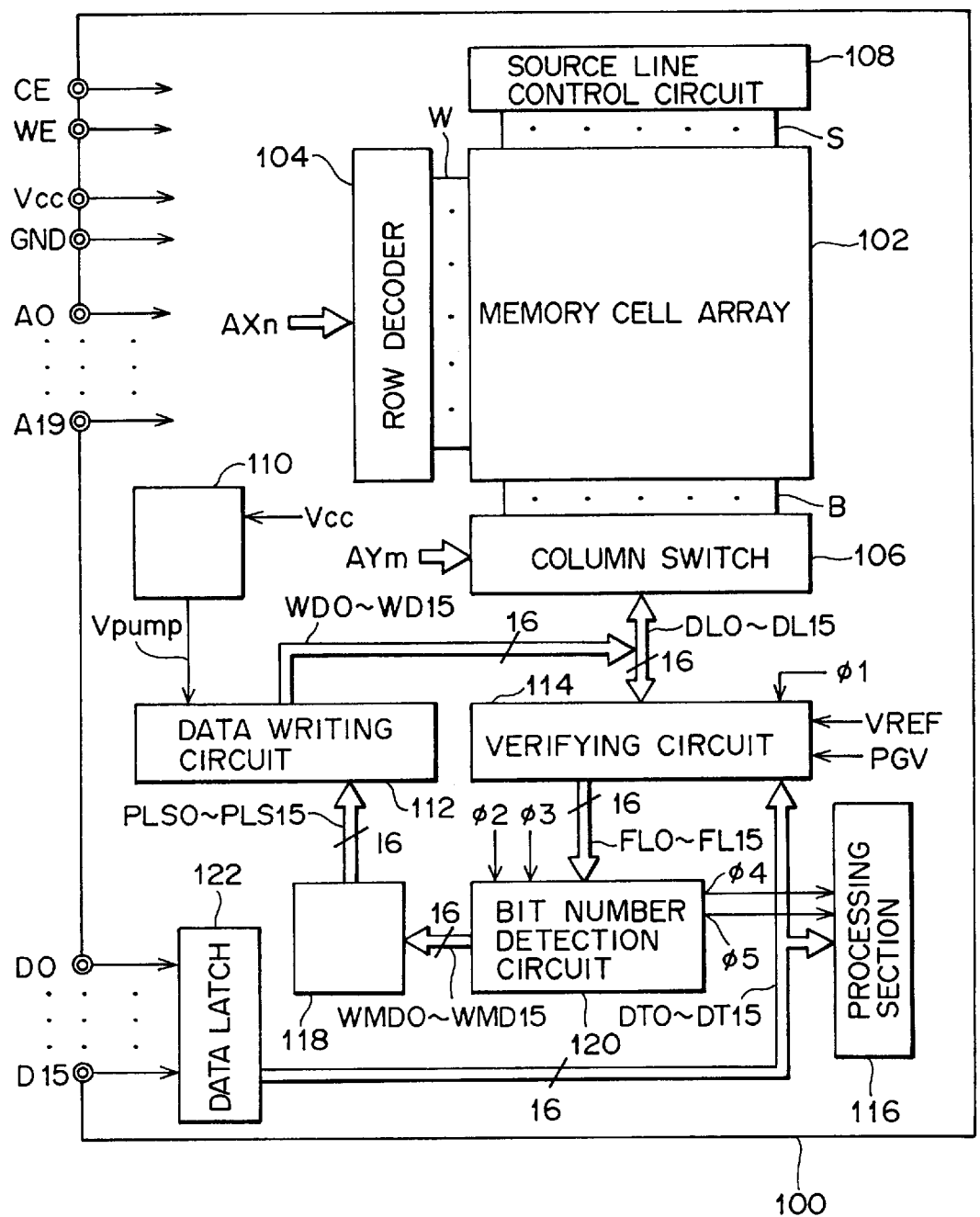
FIG. 1 is a diagram showing a non-volatile semiconductor storage device 100 according to one embodiment of the present invention.

FIG. 1 is a block diagram showing a non-volatile semiconductor storage device 100 according to the first embodiment of the present invention. The non-volatile semiconductor storage device 100 is a 16 Mbit non-volatile memory accumulated on a semiconductor substrate. The non-volatile semiconductor storage device 100 has address pins for receiving address signals A0 to A19, data pins for receiving data signals D0 to D15, a power source pin and other pins (CE, WE, and so on) for receiving various control signals. The non-volatile semiconductor storage device 100 has an address area of 1 MB, and the number of acceptable memory cells at a time in the non-volatile semiconductor storage device 100 is sixteen.

The non-volatile semiconductor storage device 100 comprises a memory cell array 102 having matrix formed non-volatile memory cells, a row decoder 104 and a column switch 106. The row decoder 104 selects word lines W on the basis of a row address Axn of the address signals A0 to A19. The column switch 106 selects sixteen bit lines B on the basis of a column address AYm of the address signals A0 to A19.

Figure 2:
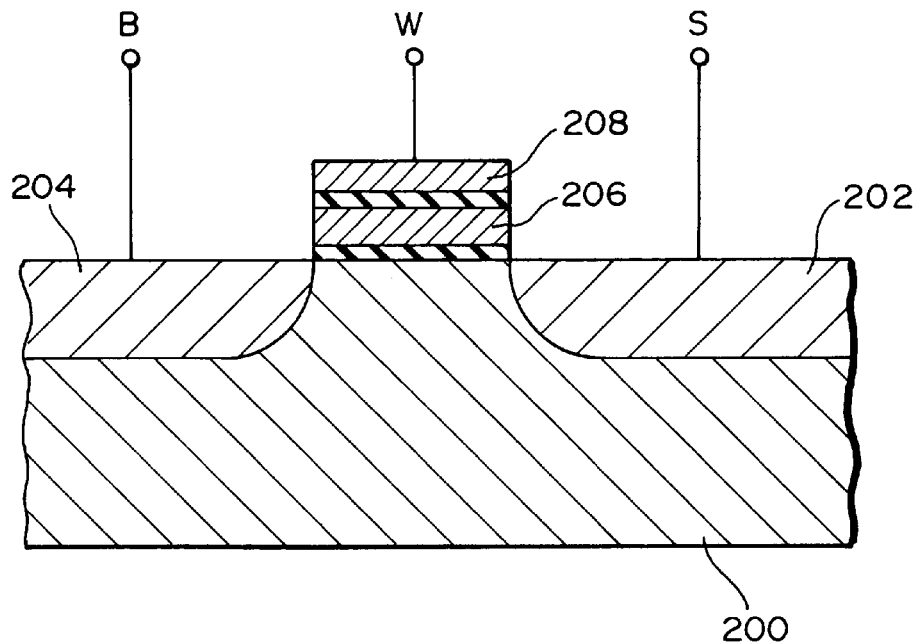
FIG. 2 is a diagram showing the device structure of a non-volatile memory cell.

As shown in FIG. 2, each of the memory cells comprises a source area 202 and a drain area 204 which are formed in a semiconductor substrate 200, and a gate electrode having a floating gate 206 and a control gate 208. The control gate 208 of each memory cell is connected to a corresponding word line W. The drain area 204 of each memory cell is connected to a corresponding bit line B. The source area of each memory cell is connected to a source line control circuit 108 via a corresponding source line S.

For data writing to each memory cell, a voltage of 12 V is applied to the control gate 208, a voltage of 6 to 7 V is applied to the drain area 204, and a voltage of 0 V is applied to the source area 202. When the data writing starts, electrons are injected to the floating gate 206. This causes apparent increase of a threshold value for a transistor in each memory cell. Therefore, potential applied to the control gate 208 for data reading is not enough for activating the transistor. Hereinafter, a written memory cell is referred as "0", and an unwritten memory cell is referred as "1".

The 16-bit data read out from the cell selected by the column switch 106 shown in FIG. 1 is supplied to a verifying circuit 114 via the data lines DL0 to DL15.

The verifying circuit 114 further receives expected values for the data writing DT0 to DT15 which are latched by a data latch 122. The verifying circuit 114 compares the expected values DT0 to DT15 with the read 16-bit data bit by bit. The result of the comparison is supplied to a bit number detection circuit 120 as data rewriting flags FL0 to FL15. The bit number detection circuit 120 specifies target memory cells for the data writing on the basis of flags indicating uncoincidence in the data rewriting flags FL0 to FL15. The bit number detection circuit 120 activates writing pulse control signals WMD0 to WMD15 corresponding to the specified memory cells. A writing pulse generation circuit 118 receives the writing pulse control signals WMD0 to WMD15 and generates corresponding writing pulse signals PLS0 to PLS15 at a predetermined timing.

A writing voltage generating circuit 110 boosts a source voltage to 6 to 7 V to generate a writing voltage Vpump in response to a writing command. The writing voltage generating circuit 110 supplies the writing voltage Vpump to a data writing circuit 112.

The data writing circuit 112 receives the writing pulse signals PLS0 to PLS15 and the writing voltage Vpump. Then, the data writing circuit 112 applies the writing voltage Vpump to data writing lines WD0 to WD15 corresponding to the activated writing pulse signals PLS0 to PLS15. Thus, the writing voltage Vpump is applied to drain electrodes 204 of target memory cells for the data writing and the data are written to target memory cells.

The writing voltage generating circuit 110 has ability to supply writing currents to four memory cells at a time.

The non-volatile semiconductor storage device 100 comprises a processing section 116. The processing section 116 generates a plurality of control signals, a plurality of timing signals N1 to N3, and the like in response to commands supplied from the data pins and other pins for receiving various control signals. The processing section 116 also has computing function and performs information processing in the non-volatile semiconductor storage device 100.

Detailed explanation of circuits in the non-volatile semiconductor storage device 100 and their operations will now be described with reference to FIGS. 3 to 7.

Figure 3:
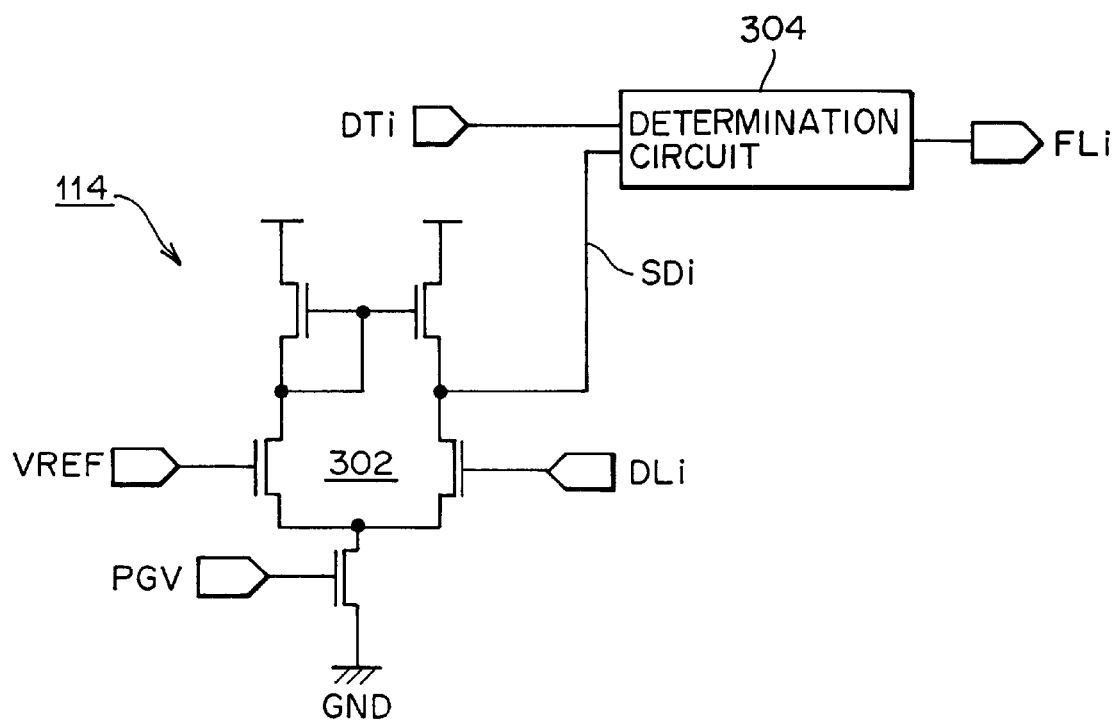
FIG. 3 is a diagram showing the structure of a verifying circuit 114 shown in FIG. 1.

FIG. 3 shows one of sixteen comparing sections in the verifying circuit 114. Each of the comparing sections comprises a differential type comparing circuit 302 and a determination circuit 304. The comparing circuit 302 compares reference potential VREF with read data DLi (i=0 to 15) in response to a verifying mode signal PGV supplied from the processing section 116. The comparing circuit 302 supplies to the determination circuit 304 comparison signals SDi (i=0 to 15) indicating the results of the comparison.

As aforementioned, the memory cell shown in FIG. 2 does not come on when its state is "0" (data is written in the cell) even if the cell is selected, and the cell outputs a signal indicating "1" (high level). The memory cell whose state is "1" (data in the cell is erased) comes on when the cell is selected, and the cell outputs a signal indicating "0" (low level). In the case where data is written in the accessed memory cell (the state of the cell is "0"), the potentials of the read data DLi become higher than the reference potential VREF and the low level comparison signals SDi are output from the cell. In the case where data in the accessed memory cell is erased (the state of the cell is "1"), the potentials of the read data DLi become lower than the reference potential VREF, and the high level comparison signals SDi are output from the cell. The determination circuit 304 receives the comparison signals SDi and expected values for data writing DTi (i=0 to 15) and outputs data rewriting flags FLi (0 to 15).

Figures 4, 5:
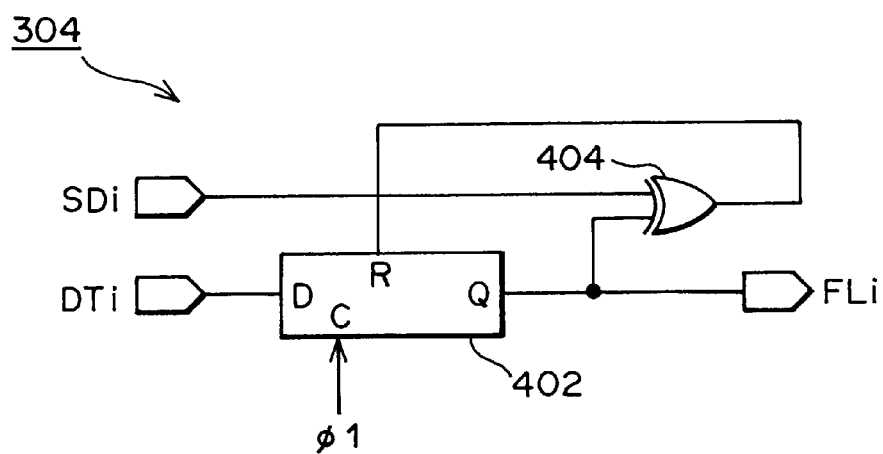
FIG. 4 is a diagram showing the structure of a determination circuit 304 shown in FIG. 3.
FIG. 5 is a diagram showing a truth value table used in the determination circuit 304 shown in FIG. 4.

As shown in FIG. 4, the determination circuit 304 comprises a latch circuit 402 and an exclusive OR circuit 404.

The latch circuit 402 has a data input terminal D, a clock input terminal C, a reset signal input terminal R and a data output terminal Q. The expected values for data writing DTi are supplied to the data input terminal D and a timing signal N1 in input to the clock input terminal C. The latch circuit 402 takes the supplied expected values DTi in response to the input timing signal N1. The data output terminal Q is used for outputting the taken expected values DTi. The exclusive OR circuit 404 generates a reset signal and supplies it to the reset signal input terminal R of the latch circuit 402. The latch circuit 402 resets level of the supplied reset signal to "1". The exclusive OR circuit 404 turns the reset signal to active level (that is, the reset signal is activated) when coincidence of logical levels of two input signals is detected.

FIG. 5 is a truth value table of the determination circuit 304. When the data writing is necessary, level of the data rewriting flag FLi is "0" (Pattern 3). In other words, in the case where the expected values DTi is "0" being instructing data writing and the comparison signal SDi is "0" being indicating data in the memory cell is erased, the latch circuit 402 latches a "0" level signal in response to the timing signal N1. The latch circuit 402 outputs the latched signal as the data rewriting flag FLi.

When the expected value DTi coincides with the comparison signal SDi (Pattern 1, Pattern 4), the exclusive OR circuit 404 resets the level of the latch circuit 402 to "1" and the data rewriting flag FLi also becomes "1". In this case, the cell already stores the expected value, therefore, data writing no longer is necessary.

When the expected value is "1" being instructing data writing and the comparison signals SDi is "1" being indicating the cell is written, the data writing is unnecessary. In this case, the latch circuit 402 latches a level "1" signal and the data rewriting flag FLi also becomes "1".

Figure 6:
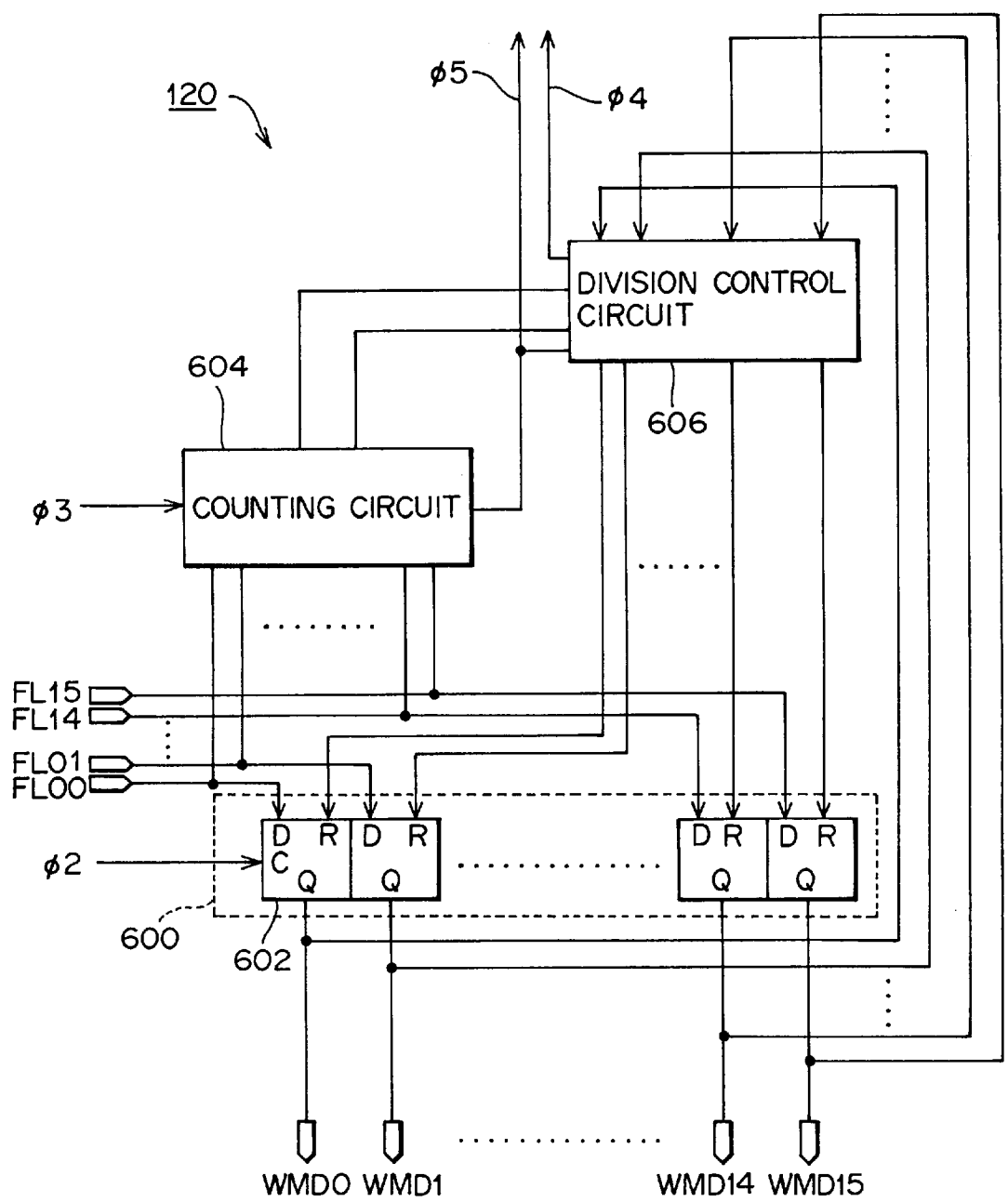
FIG. 6 is a diagram showing the structure of a bit number detection circuit 120 shown in FIG. 1.

FIG. 6 shows detailed structure of the bit number detection circuit 120. As shown, the bit number detection circuit 120 comprises latch circuits 600, a counting circuit 604 and a division control circuit 606. The latch circuits 600 include sixteen latch circuits 602. Each of the latch circuits 602 comprises a data input terminal D, a clock input terminal C, a reset signal input terminal R and a data output terminal Q. Each of the latch circuits 602 receives corresponding data rewriting flag of the data rewriting flags FL0 to FL15 via its data input terminal D. Timing signals N2 following to the timing signals N1 are generated. Each of the latch circuits 602 latches the received data rewriting flag in response to the timing signal N2. The data output terminals Q of the latch circuits 602 are used for outputting the latched flags.

The data rewriting flags FL0 to FL15 are also supplied to the counting circuit 604. Timing signals N3 following to the timing signals N2 are successively generated. The counting circuit 604 counts the number of the activated data rewriting flags (indicating "0") in response to the timing signals N3. The counting circuit 604 supplies the count value to the division control circuit 606.

The division control circuit 606 further receives data writing pulse control signals WMD0 to WMD15. The data writing pulse control signals WMD0 to WMD15 are output signals from the latch circuits 600. On the basis of the count value from the counting circuit 604, the division control circuit 606 supplies reset signals to the latch circuits 602 to be reset.

The counting circuit 604 is a binary counter and express the count value with binary notation. The counting circuit 604 sequentially checks logical level of the data rewriting flags FL0 to FL15 in response to the timing signals N3 which are supplied sixteen times successively. If the checked flag shows "0", the counter increases the count value by 1.

As shown in FIG. 7, "0000" is initially set to the counting circuit 604. When "0" is detected first, the counter is allowed to count the number of the flags. The counter counts up the count value with increment operation in accordance with detection of "0" after the counting is allowed. That is, the first detection of "0" does not invoke the increment operation. If the counter is not allowed to count the flags after the timing signals N3 are supplied to the counter sixteen times (no "0" level is detected), timing signals N5 are generated. The timing signals N5 are supplied to the division control circuit 606 and the processing section 116 to inform that there is no target memory cell for the data writing.

As shown in FIG. 7, output values of the counting circuit 604 are upper 2 bits of corresponding count values. That is, each of the count values "1" to "4" corresponds to the output value "00". Each of the count values "5" to "8" corresponds to the output value "01". Each of the count values "9" to "12" corresponds to the output value "10". Each of the count values "13" to "16" corresponds to the output value "11". If the count value is "0", the timing signals N5 are generated, as described above.

Following is detailed description of the division control circuit 606 when it receives the output values from the counting circuit 604. When the received output value is "00", the division control circuit 606 does not supply the reset signals to the latch circuits 600 because the number of target memory cells for the data writing is four or less.

When the received output value is "01", the number of target memory cells for the data writing is 5 to 8. In this case, data writing at a time is incapable. That is, the data writing must be performed in two installments. The division control circuit 606 supplies the reset signals to the latch circuits 602 expect the first four circuits. Those latch circuits 602 correspond to the activated pulse control signals WMD0 to WMD15. The contents of the latch circuits 602 after which receive the reset signals are reset to "1". Thus, the four latch circuits 602 to which no reset signal is supplied are still set to "0".

The division control circuit 606 supplies the reset signals to the latch circuits 602 expect the reset circuits (the number of them is 1 to 4) to reset their contents to "1". Before this operation, the data writing operations to four memory cells corresponding to the set latch circuits 602 are completed, the timing signals N2 are generated, and the contents of the latch circuits 600 return to the contents before the circuits are reset.

In the same manner, when the output value is "10", that is, the number of target memory cells for the data writing is "9" to "12", the data writing operation must be performed in three installments. The division control circuit 606 supplies the reset signals to the latch circuits 602 expect the first four circuits. Those latch circuits 602 correspond to the activated pulse control signals WMD0 to WMD15. The contents of the latch circuits 602 after which receive the reset signals are reset to "1". Thus, the four latch circuits 602 to which no reset signal is supplied are still set to "0".

Then, the data writing operations to four memory cells corresponding to the four latch circuits are performed. The timing signals N2 are generated and the contents of the latch circuits 600 again return to the contents before the circuits are reset. After those operations, the division control circuit 606 supplies the reset signals to the other latch circuits 602 expect the circuits corresponding to four memory cells following to the data written four memory cells. Thus, the four latch circuits 602 to which no reset signal is supplied are still set to "0". The data writing operations to four memory cells corresponding to the four latch circuits 602 which are set to "0" are performed.

Finally, the division control circuit 606 supplies the reset signals to the latch circuits 602 expect the reset circuits (the number of them is 1 to 4) to reset their contents to "1". Before this operation, the data writing operations to four memory cells corresponding to the set latch circuits 602 are completed, the timing signals N2 are generated, and the contents of the latch circuits 600 return to the contents before the circuits are reset.

In the case where the output value is "11", that is, the number of target memory cells for the data writing is "13" to "16", operations are performed in the same manner. That is, the reset signals are supplied to the latch circuits 602 expect the first four circuits to reset their contents to "1". Then, the other latch circuits 602 expect four circuits following to the circuits which are already reset are reset.

Further, the other latch circuits 602 expect four circuits following to the circuits which are already reset are reset. Finally, the reset signals are supplied to the latch circuits other than the circuits corresponding to unwritten memory cells (the number of those is "1" to "4") to reset their contents to "1".

Figure 8:
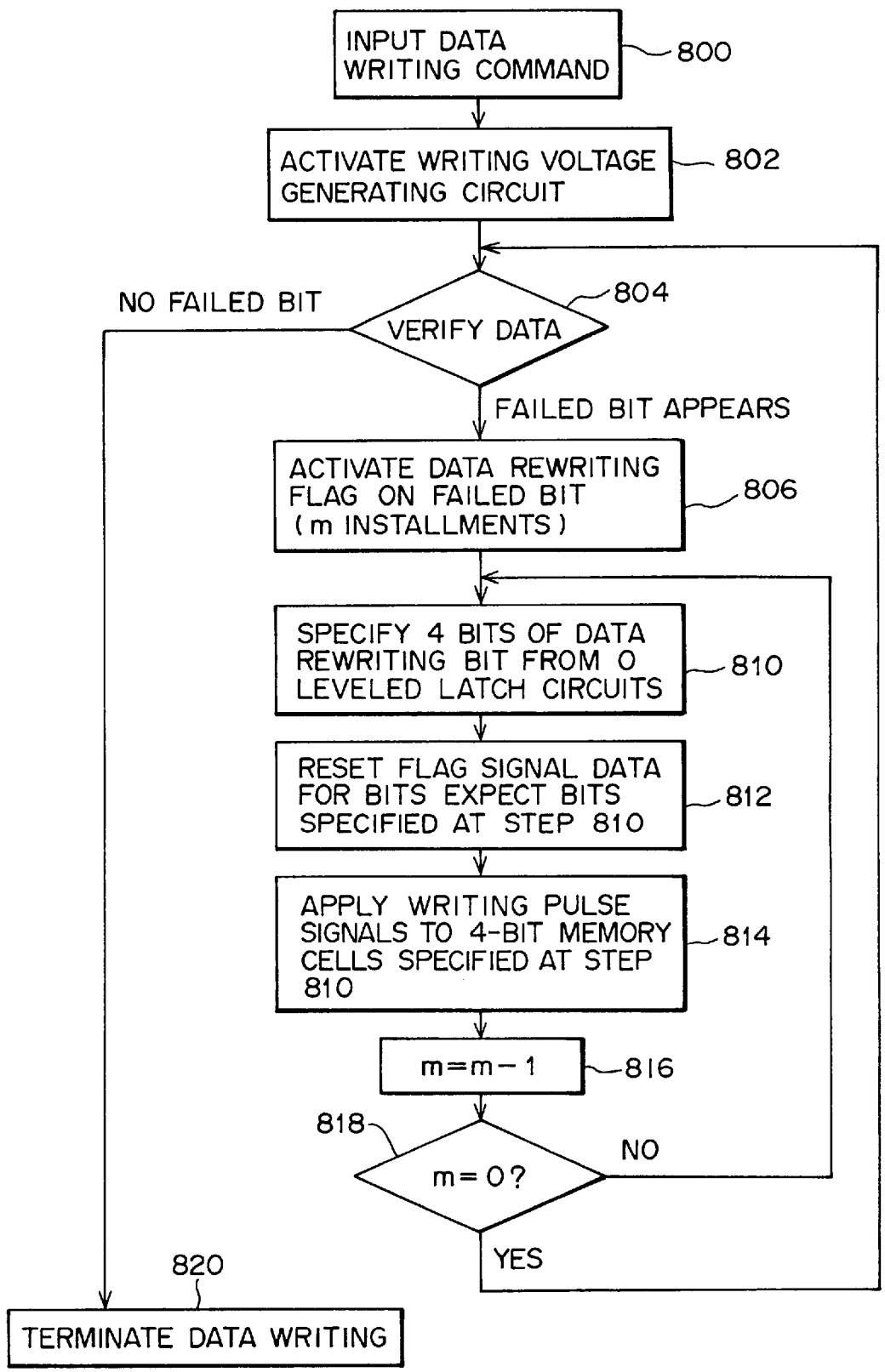
FIG. 8 is a flowchart for explaining an operation of the non-volatile semiconductor storage device 100.

The data writing operation in the non-volatile semiconductor storage device 100 having the above described structure will now be described with reference to a flowchart shown in FIG. 8.

A command of "write data" is externally input to the data pins D0 to D15 and the control signal pins. The processing section 116 reads and understand the input command, and activates data writing mode (step 800). The processing activates the writing voltage generating circuit 110. The activated writing voltage generating circuit 110 generates the writing voltage Vpump (step 802). Address signals are supplied to the address pins A0 to A19. The row decoder 104 and the column switch 106 access the memory cells whose addresses are designated by the supplied address signals. Data stored in the accessed memory cells are read out to be supplied to the verifying circuit 114 via the data lines DL0 to DL 15. The verifying circuit 114 compares the data with the expected values for data writing DT0 to DT15 as described above (step 804).

If the result of the comparison shows complete coincidence between the read data DL0 to DL15 and the expected values DT0 to DT15 (with no failed bit), the levels of all the data rewriting flags FL0 to FL15 turn to "1". As described above, the counting circuit 604 generates the timing signals N5. The processing section 116 receives the timing signals N5 and terminates the data writing operation (step 820).

If uncoincidence between the read data and the expected values is, for example, "Pattern 2" shown in FIG. 5, the levels of the flags FLi turn to "1" and the data writing operation is terminated as well as the case where the complete coincidence is detected. In this case, the expected values and values actuary written to the memory cells do not coincide. However, such data rewriting operation requiring data erasing operation seldom occurs. Therefore, such uncoincidence may be ignored. Outputs of the exclusive OR circuit 404 can be used for detection whether the data writing needs the erasing operation. Therefore, the erasing operation may be executed when it is detected that the data writing needs the erasing operation in the case where the storage device is used in the environment in which such data rewriting often occurs.

If the counting circuit 604 detects unwritten memory cells which are targeted for the data writing (failed bits are detected), following sequential steps for the data writing are executed.

Upper 2 bits of the count value counted by the counting circuit 604 is supplied to the division control circuit 606. The division control circuit 606 determines division number m (step 806). The 2-bit values "00", "01", "10" and "11" respectively correspond to the division numbers "1", "2", "3" and "4".

The division control circuit 606 specifies 4-bit data rewriting bits in the "0" leveled latch circuits 602 in accordance with the upper 2 bits of the count value, that is, the division number m (step 810). The division control circuit 606 supplies the latch circuits 602 expect the specified circuits (step 812) to reset their levels to "1". As described above, the specified 4-bit data rewriting bits are the first 4 bits of target bits for the data writing.

This causes activation of four (or less) data writing pulse control signals WMD0 to WMD15. The activation is caused regardless of the number of the bits targeted for the data writing. The activated signals are supplied to the data writing pulse generating circuit 118. The data writing pulse generating circuit 118 generates the data writing pulse signals PLS0 to PLS15 corresponding to the activated four (or less) signals of the data writing pulse control signals WMD0 to WMD15. The data writing circuit 112 supplies the writing voltage Vpump to the data writing lines WD0 to WD15 corresponding to the data writing pulse signals PLS0 to PLS15 (step 814). Thus, the writing voltage Vpump is supplied to drain electrodes of the first four (or less) memory cells which are targeted for the data writing. The data are written in those memory cells.

The division control circuit 606 decrements the division number m by 1 (step 816). If the decremented division number is 0, it is determined that the first cycle of the data writing operation is completed. Then, the division control circuit 606 generates timing signals N4. The processing section 116 receives the timing signals N4 and makes the verifying circuit 114 execute the verifying operation (step 804) again. If correct data writing without failed bits is detected after the verifying operation, the data writing operation is terminated (step 820).

If the decremented division number is not 0, the division control circuit 606 specifies 4 (or less) bits other than the former selected bits (step 810). The division control circuit 606 applies the writing voltage Vpump to the memory cells of the specified 4 (or less) bits in the same manner. This operation is repeated until the division number becomes 0.

After the first cycle of the data writing operation is thus completed, the verifying operation (step 804) is executed again. If it is detected that there is no failed bit after the verifying operation, the data writing operation is terminated (step 820). If some or all of the target bits are unwritten bits, however, new data rewriting flags FL0 to FL15 corresponding the failed bits are generated. In this case, if all of the target bits are unwritten bits, values of the newly generated flags FL0 to FL15 are the same as those in former case. If some of the target bits are unwritten bits, the values of the new flags differ from those in former case, and flags corresponding to correctly written memory cells of the target cells are not activated.

The division control circuit 606 applies the writing voltage Vpump to the memory cells corresponding to the new data rewriting flags FL0 to FL15 in one or more installment (s). Then, the verifying operation (step 804) is executed again. Those steps are repeated until data is written to all of the target memory cells, in other words, until the failed bit is not detected. When it is determined that there is no failed bit, the counting circuit 604 generates the timing signals N5, then, whole of the data writing operation is terminated (step 820).

As described above, the non-volatile semiconductor storage device 100 counts the number of the target memory cells for the data writing with the counting circuit 604 and specifies four memory cells for the data writing on the basis of the counted value. This causes shortening time for data writing corresponding to the number of the memory cells for the data writing.

More precisely, the non-volatile semiconductor storage device 100 requires data writing operation only once per a cycle for writing 16-bit data to memory cells of 4 bits. On the contrary, a conventional storage device requires four times of data writing operations per a cycle, and each of the installments requires 4-bit data writing. Time for the data writing in the non-volatile semiconductor storage device 100 in this embodiment is shortened.

Moreover, the storage device in this embodiment is effective especially for a case where several cycles are required for correct data writing with following reason. The counting circuit 604 counts the memory cells to which data are not correctly written when the data writing is not completed in former cycle. Then, the memory cells for once data writing operation in next cycle are specified. More precisely, the data writing operation in three installments is performed in 1 cycle for writing 16-bit data to the memory cells of 12 bits. For example, if the data are correctly written to the memory cells of 8 bits but data writing to rest 4 bits is failed, the required data writing in the second cycle is once.

Thus, the non-volatile semiconductor storage device 100 in this embodiment greatly shortens data writing time.

A non-volatile semiconductor storage device according to the second embodiment of the present invention will now be described.

The structure of a circuit in a non-volatile semiconductor storage device in the second embodiment is almost the same as that for the non-volatile semiconductor storage device 100 in the first embodiment. Following is differences between them. The counting circuit 604 outputs upper 3 bits (not 2 bits) of the count value to the division control circuit 606. The division control circuit 606 performs dividing operations on the basis of the 3-bit values.

The feature of this non-volatile semiconductor storage device is to reduce unevenness of the number of the memory cells to which data is written with one operation. To realize this, the counting circuit 604 supplies the upper 3 bits of the count value to the division control circuit 606 to optimize its division control performance.

FIG. 9 is a table showing dividing operation performed in the non-volatile semiconductor storage device according to the second embodiment. "Assignment 1" in FIG. 9 indicates a division assigning operation of the non-volatile semiconductor storage device 100 in the first embodiment. "Assignment 2" indicates a division assigning operation of the non-volatile semiconductor storage device in this embodiment.

More precisely, if the counted value is "5" or "6", the counting circuit 604 outputs its upper 3-bit value "010". The division control circuit 606 receives the 3-bit value and divides the memory cells targeted for the data writing into two groups.

In the storage device 100 in the first embodiment, the memory cells are also divided into two groups. When the count value is "5", the relationship between division number and times of operation per cycle is expressed as "4-1" (That is, the number of the memory cells in the former group is four, and the data is written to those four cells in the first data writing operation of the data writing operation. Then the data is written to rest of one cell in the second data writing operation.). When the count value is "6", the relationship is expressed as "4-2" (That is, the data is written to four cells in the first data writing operation, and the data is written to rest of two cells in the second data writing operation.).

In the non-volatile semiconductor storage device in this embodiment, the relationship when the count value is "5" is "3-2" (the data is written to three cells in the first data writing operation, and the data is written to rest of two cells in the second data writing operation), and the relationship when the count value is "6" is "3-3" (the data is written to three cells in the first data writing operation, and the data is written to rest of three cells in the second data writing operation).

In the same manner, when the count value is "9" or "10", the counting circuit 604 outputs its 3-bit value "100" to the division control circuit 606. The division control circuit 606 divides the memory cells targeted for the data writing into three groups. When the count value is "9", the relationship is "3-3-3" (the data is written to three cells in each installment). When the count value is "10", the relationship is "4-3-3" (the data is written to four cells in the first data writing operation, and the data is written to three cells in the second and third data writing operations).

When the count value is "13" or "14", the counting circuit 604 outputs its 3-bit value "110", to the division control circuit 606. The division control circuit 606 divides the memory cells targeted for the data writing into four groups as "4-3-3-3" for the count value "13" or "4-4-3-3" for the count value "14".

Accordingly, the non-volatile semiconductor storage device in this embodiment uses upper 3-bit value of the count value to detect unevenness of the number of divided bits (for example, "4-1"). When the unevenness occurs, the number of divided bits are equalized. This reduces the power consumption of the writing voltage generating circuit 110 and improves the reliability because stress applied to the cells when the data writing is equalized. The operation of the non-volatile semiconductor storage device when the count value is "1", "2", "3", "4", "7", "8", "11", "12", "15" or "16" is the same as that for the non-volatile semiconductor storage device 100 in the first embodiment.

A non-volatile semiconductor storage device according to the third embodiment of the present invention will now be described.

Figure 10:
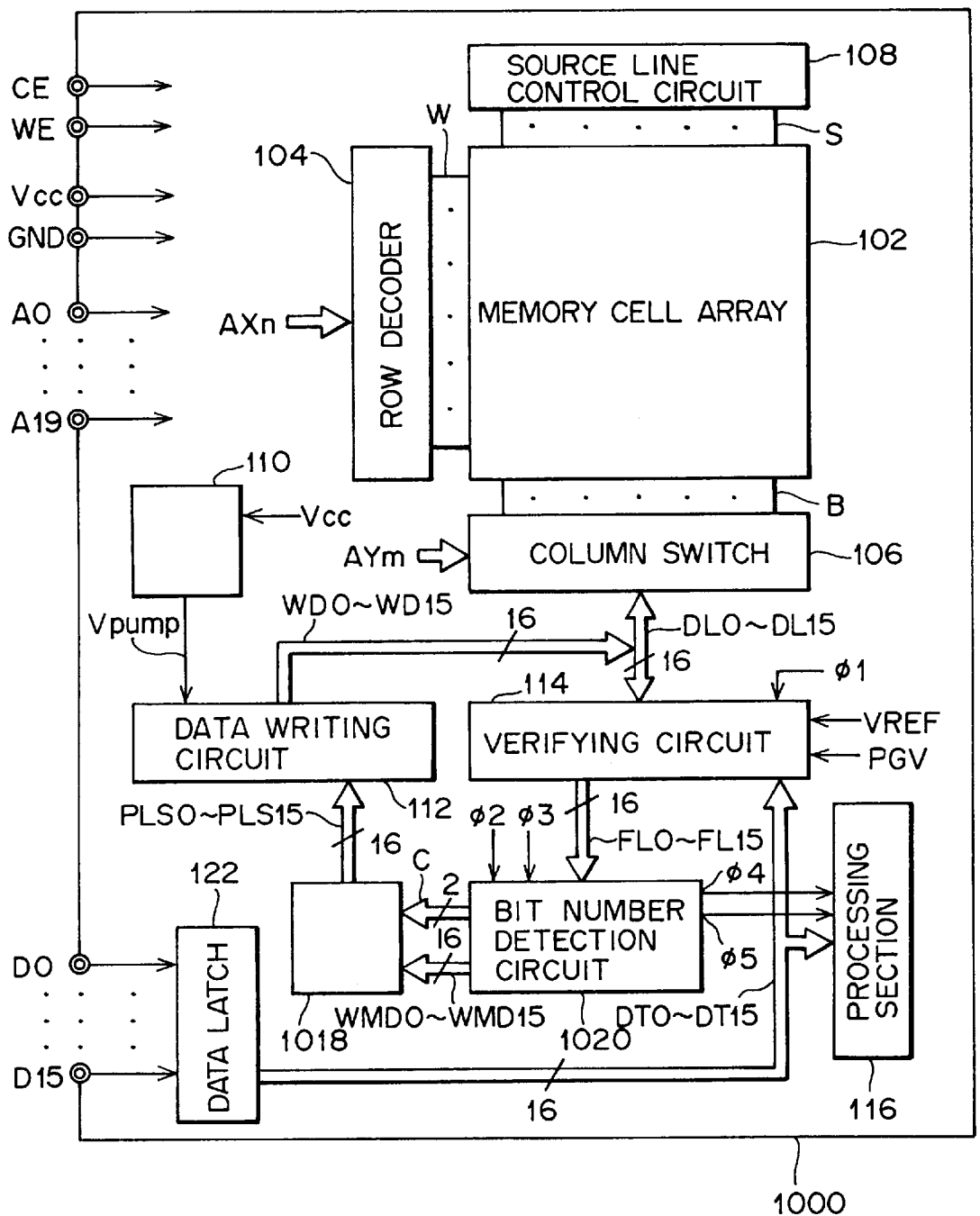
FIG. 10 is a diagram showing a non-volatile semiconductor storage device 1000 according to the third embodiment of the present invention.

FIG. 10 is a block diagram showing a non-volatile semiconductor storage device 1000 according to the third embodiment.

A verifying circuit and a data writing pulse generating circuit in the non-volatile semiconductor storage device 1000 in the third embodiment differ from those in the non-volatile semiconductor storage device 100 in the first embodiment.

Figure 11:
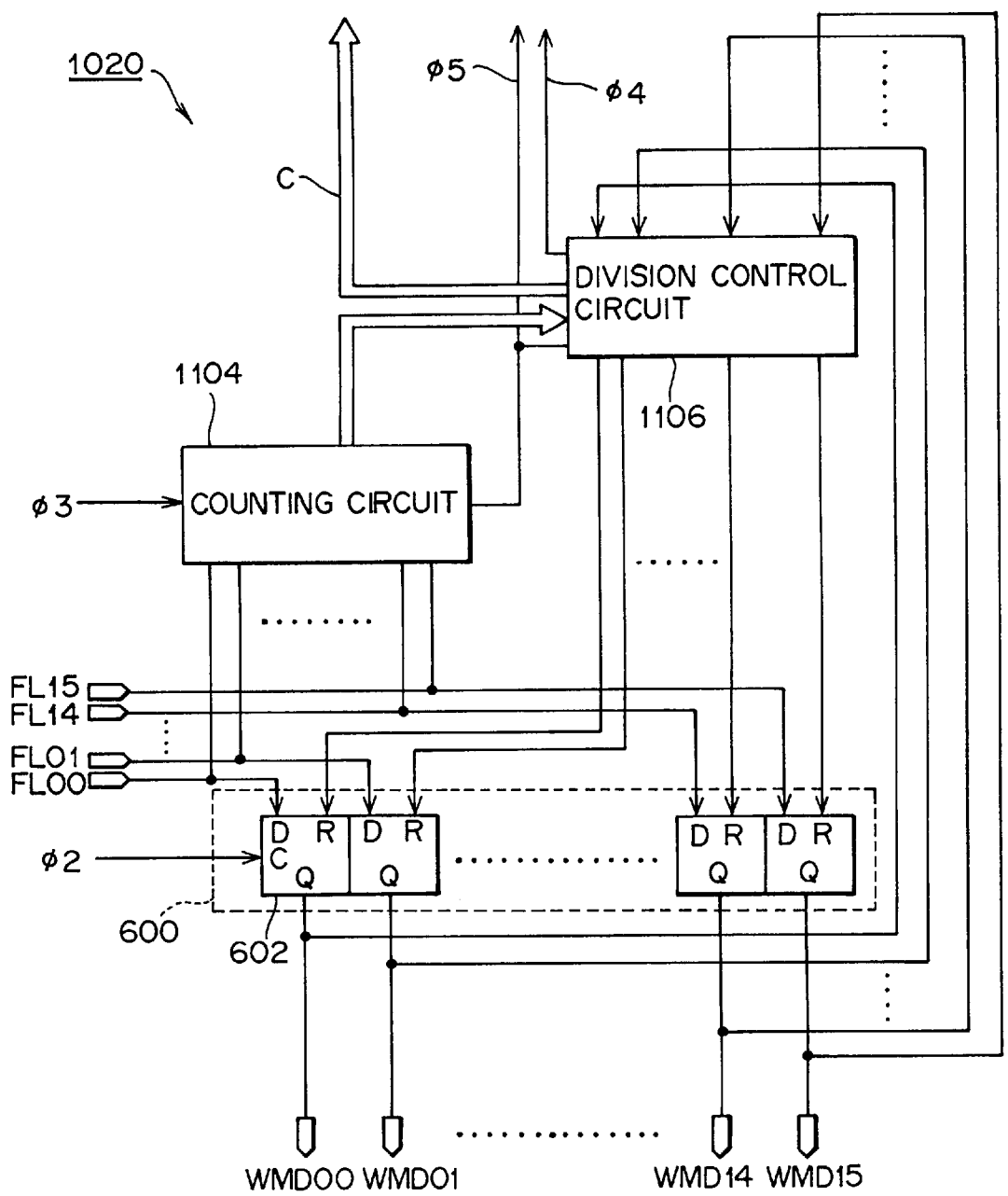
FIG. 11 is a diagram showing the structure of a bit number detection circuit 1020 shown in FIG. 10.
Figure 12:
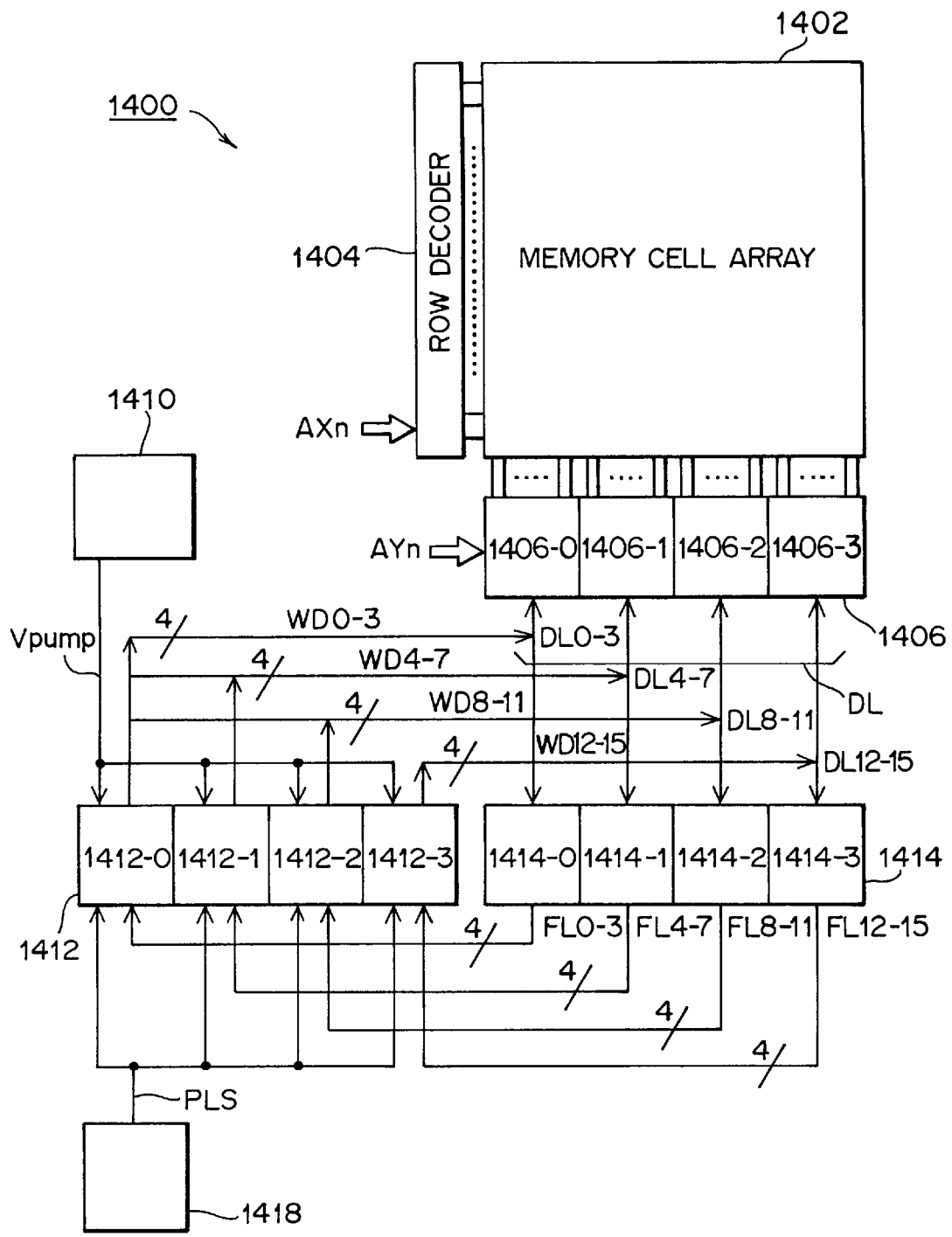
FIG. 12 is a diagram showing a conventional non-volatile semiconductor device 1400.
Figure 13:
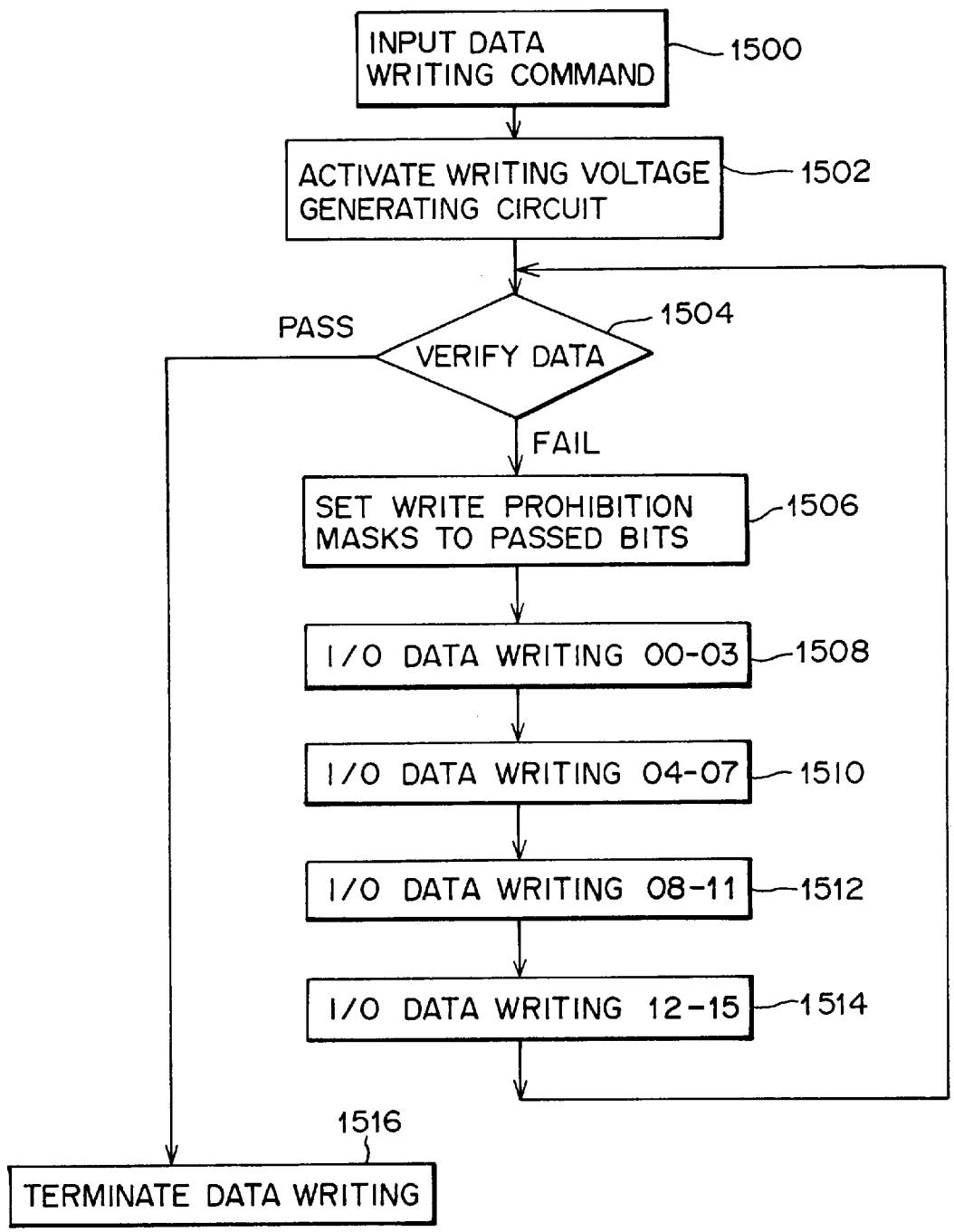
FIG. 13 is a flowchart for explaining an operation of the conventional non-volatile semiconductor storage device 1400.

FIG. 11 shows a circuit of a verifying circuit 1020 in the non-volatile semiconductor storage device 1000.

In FIG. 11, a counting circuit 1104 counts the number of the activated data rewriting flags FL0 to FL15 on the basis of timing signals N3. The timing signals N3 are successively supplied to the counting circuit 1104. The counting circuit 1104 supplies the count value to a division control circuit 1106. The division control circuit 1106 divides target bits for the data writing into several groups on the basis of the supplied count value as well as the division control circuit 606. Unlike the division control circuit 606, however, the division control circuit 1106 supplies a signal C indicating the number of bits in each of the groups to a data writing pulse generating circuit 1018.

For example, if the count value from the counting circuit 1104 is "5", the division control circuit 1106 divides the cells into two groups as "4-1", and supplies to the data writing pulse generating circuit 1018 the signal C when the first operation for "4"-bit data writing is performed. This signal C indicates "11" which represents "4". The division control circuit 1106 supplies to the data writing pulse generating circuit 1018 another signal C when the second operation for "1"-bit data writing. This signal C indicates "00" which represents "1".

When the count value is "5", the division control circuit 1106 may divide the cells into two groups as "3-2". In this case, the signal C indicating "10" which represents "3" is supplied to the data writing pulse generating circuit 1018 when the first operation for the "3"-bit data writing is performed. Another signal C indicating "01" which represents "2", is supplied to the data writing pulse generating circuit 1018 when the second operation for the "2"-bit data writing is performed.

The data writing pulse generating circuit 1018 adjusts the pulse widths of the data writing pulse signals PLS0 to PLS15 on the basis of the received signal C. That is, the pulse width is not changed when the signal C indicating "11" which represents "4". When the signal C indicates "10", "01" or "00", that is, the number of target memory cells for the data writing is small, the pulse width is narrowed. Thus, the power consumption when the number of target memory cell for the data writing at a time is small. Moreover, the reliability of the cells improves because the stress applied to the memory cells is equalized.

The present invention is not limited to the embodiments described above, but may be modified as needed.

For example, the counting circuit 604 may be omitted and the processing section 116 may execute counting operation. The present invention may be employed for a system which erase memory cells once when data rewriting.

The number of the memory cells m (a natural number) for simultaneous data writing may be set arbitrary in accordance with the current supply ability of the writing voltage generating circuit 110.

As described above, the present invention realizes reduction of data writing time for divisional data writing in accordance with ability of a writing voltage generating circuit.

What is claimed is:

1. A non-volatile semiconductor storage device comprising:

a plurality of non-volatile memory cells;

reading means for reading out data stored in said plurality of non-volatile memory cells;

comparing means for comparing said data read out by said reading means with latched data to be stored in said plurality of memory cells;

counting means for counting the number of memory cells of said plurality of non-volatile memory cells for storing said latched data on the basis of a result of said comparing means; and writing means for specifying at least some of said memory cells for storing said latched data on the basis of a count value of said counting means, and for writing said latched data to the specified memory cells simultaneously.

2. The non-volatile semiconductor storage device according to claim 1, wherein said writing means (1) simultaneously writes the latched data to all of the specified memory cells when said count value of said counting means does not exceed a predetermined value, and (2) specifies at least some of the specified memory cells when said count value exceeds said predetermined value and simultaneously writes some of the latched data to them, then, specifies at least some memory cells of the rest of said specified cells and simultaneously writes the remaining latched data to them.

3. The non-volatile semiconductor storage device according to claim 2, further comprising a writing voltage generating circuit for supplying a current for the data writing to said writing means, wherein said predetermined value is determined in accordance with the ability of said writing voltage generating circuit.

4. The non-volatile semiconductor storage device according to claim 3, wherein
said writing means comprises means for controlling a duration of the data writing current in accordance with a number of memory cells accessed for simultaneous data writing.

5. The non-volatile semiconductor storage device according to claim 1, wherein said writing means
(1) simultaneously writes the data to all of the specified memory cells when said count value of said counting means does not exceed a predetermined natural value m, and
(2) specifies m memory cells in said specified memory cells when said count value exceeds said predetermined natural value m and simultaneously writes some of the latched data to them, then, specifies at least some memory cells in the rest of said specified cells and simultaneously writes the remaining latched data to them.

6. The non-volatile semiconductor storage device according to claim 5, further comprising a writing voltage generating circuit having the ability to supply currents for writing the data to the m memory cells simultaneously.

7. The non-volatile semiconductor storage device according to claim 6, wherein said writing means comprises means for controlling supply time of the data writing current so as to be shortened in accordance with decrease of the number of the memory cells for the simultaneous data writing less than m.

8. The non-volatile semiconductor storage device according to claim 1, wherein said writing means
(1) simultaneously writes the latched data to all of the specified memory cells when said count value of said counting means does not exceed a predetermined natural value m, and
(2) specifies times for the latched data writing and the number of the memory cells when said memory cells are less than m per a latched data writing, and simultaneously writes the corresponding latched data to said less than m specified memory cells said specified times.

9. The non-volatile semiconductor storage device according to claim 8, further comprising
a writing voltage generating circuit having the ability to simultaneously write said corresponding latched data to the specified m memory cells.

10. The non-volatile semiconductor storage device according to claim 9, wherein
said writing means comprises means for controlling a duration of the data writing current so as to be shortened in accordance with a decrease of a number of memory cells accessed for the simultaneous data writing less than m.

11. The non-volatile semiconductor storage device according to claim 1, wherein each of said plurality of non-volatile memory cells comprises a transistor having a floating gate, and injecting electrons to said floating gate causes said data writing.

12. A method for writing data to non-volatile memory cells comprising the steps of:
reading out data stored in a plurality of non-volatile memory cells;
comparing said read data with data to be stored in said plurality of memory cells, and
counting a number of remaining memory cells for data writing; and
specifying some of said memory cells for the data writing on the basis of a count value, and
simultaneously writing data to said specified memory cells.

13. The method for writing data to the non-volatile memory cells according to claim 12, wherein said data writing step
(1) simultaneously writes data to all of the specified memory cells when said count value of said count does not exceed a predetermined value, and
(2) specifies at least some of the specified memory cells when said count value exceeds said predetermined value and simultaneously writes some of a latched data to them, then,
specifies at least some memory cells in the rest of said specified cells and simultaneously writes the remaining latched data to them.

14. The method for writing data to the non-volatile memory cells according to claim 13, comprising the step of
controlling a duration of the data writing current in accordance with a number of memory cells accessed for the simultaneous data writing.

15. The method for writing data to the non-volatile memory cells according to claim 12, wherein said data writing step
(1) simultaneously writes the data to all of the specified memory cells when said count value of said count does not exceed a predetermined natural value m, and
(2) specifies m memory cells in said specified memory cells when said count value exceeds said predetermined natural value m and simultaneously writes some of the latched data to them, then,
specifies at least some memory cells in the rest of said specified cells and simultaneously writes the remaining latched data to them.

16. The method for writing data to the non-volatile memory cells according to claim 15, shortening time for writing data to each of the memory cells in accordance with decrease of the number of the memory cells for the simultaneous data writing less than m.

17. The method for writing data to the non-volatile memory cells according to claim 12, wherein said data writing step
(1) simultaneously writes the latched data to all of the specified memory cells when said count value of said count does not exceed a predetermined natural value m, and
(2) specifies times for the latched data writing and the number of the memory cells when said memory cells are less than m per a latched data writing, and simultaneously writes the corresponding latched data to said less than m specified memory cells said specified times.

18. The method for writing data to the non-volatile memory cells according to claim 17, shortening time for writing data to each of the memory cells in accordance with decrease of the number of the memory cells for the simultaneous data writing less than m.

19. A non-volatile semiconductor storage device comprising:
a plurality of non-volatile memory cells;
reading device for reading out data stored in said plurality of non-volatile memory cells;
comparing device for comparing said data read out by said reading device with latched data to be stored in said plurality of memory cells;

counting device for counting the number of memory cells of said plurality of non-volatile memory cells for storing said latched data on the basis of a result of said comparing device; and writing device for specifying at least some of said memory cells for storing said latched data on the basis of a count value of said counting device, and for writing said latched data to the specified memory cells simultaneously.

20. The non-volatile semiconductor storage device according to claim 1, wherein said writing device (b) simultaneously writes the latched data to all of the specified memory cells when said count value of said counting device does not exceed a predetermined value, and (c) specifies at least some of the specified memory cells when said count value exceeds said predetermined value and simultaneously writes some of the latched data to them, then, specifies at least some memory cells of the rest of said specified cells and simultaneously writes the remaining latched data to them.

21. The non-volatile semiconductor storage device according to claim 2, further comprising a writing voltage generating circuit for supplying a current for the data writing to said writing device, wherein said predetermined value is determined in accordance with the ability of said writing voltage generating circuit.

22. The non-volatile semiconductor storage device according to claim 3, wherein said writing device comprises device for controlling a duration of the data writing current in accordance with a number of memory cells accessed for simultaneous data writing.

23. The non-volatile semiconductor storage device according to claim 1, wherein said writing device (d) simultaneously writes the data to all of the specified memory cells when said count value of said counting device does not exceed a predetermined natural value m, and (e) specifies m memory cells in said specified memory cells when said count value exceeds said predetermined natural value m and simultaneously writes some of the latched data to them, then, specifies at least some memory cells in the rest of said specified cells and simultaneously writes the remaining latched data to them.

24. The non-volatile semiconductor storage device according to claim 5, further comprising a writing voltage generating circuit having the ability to supply currents for writing the data to the m memory cells simultaneously.

25. The non-volatile semiconductor storage device according to claim 6, wherein said writing device comprises device for controlling supply time of the data writing current so as to be shortened in accordance with decrease of the number of the memory cells for the simultaneous data writing less than m.

26. The non-volatile semiconductor storage device according to claim 1, wherein said writing device (f) simultaneously writes the latched data to all of the specified memory cells when said count value of said counting device does not exceed a predetermined natural value m, and (g) specifies times for the latched data writing and the number of the memory cells when said memory cells are less than m per a latched data writing, and simultaneously writes the corresponding latched data to said less than m specified memory cells said specified times.

27. The non-volatile semiconductor storage device according to claim 8, further comprising a writing voltage generating circuit having the ability to simultaneously write said corresponding latched data to the specified m memory cells.

28. The non-volatile semiconductor storage device according to claim 9, wherein said writing device comprises device for controlling a duration of the data writing current so as to be shortened in accordance with a decrease of a number of memory cells accessed for the simultaneous data writing less than m.

29. The non-volatile semiconductor storage device according to claim 1, wherein each of said plurality of non-volatile memory cells comprises a transistor having a floating gate, and injecting electrons to said floating gate causes said data writing.

* * * * *